(12) United States Patent
Kikuiri et al.

(10) Patent No.: US 11,774,856 B2
(45) Date of Patent: Oct. 3, 2023

(54) EXTREME ULTRAVIOLET LIGHT SOURCE DEVICE

(71) Applicant: USHIO DENKI KABUSHIKI KAISHA, Tokyo (JP)

(72) Inventors: Hajime Kikuiri, Tokyo (JP); Hironobu Yabuta, Tokyo (JP)

(73) Assignee: USHIO DENKI KABUSHIKI KAISHA

( * ) Notice: Subject to any disclaimer, the term of this patent is extended or adjusted under 35 U.S.C. 154(b) by 0 days.

(21) Appl. No.: 18/007,528

(22) PCT Filed: May 11, 2021

(86) PCT No.: PCT/JP2021/017913
§ 371 (c)(1),
(2) Date: Dec. 1, 2022

(87) PCT Pub. No.: WO2021/251046
PCT Pub. Date: Dec. 16, 2021

(65) Prior Publication Data
US 2023/0213865 A1    Jul. 6, 2023

(30) Foreign Application Priority Data

Jun. 12, 2020  (JP) ................................ 2020-102424
Jun. 12, 2020  (JP) ................................ 2020-102425

(51) Int. Cl.
*G03F 7/20*       (2006.01)
*H05G 2/00*       (2006.01)
*G03F 7/00*       (2006.01)

(52) U.S. Cl.
CPC ...... *G03F 7/70033* (2013.01); *G03F 7/70916* (2013.01); *G03F 7/70983* (2013.01); *H05G 2/008* (2013.01)

(58) Field of Classification Search
CPC ............. G03F 7/70033; G03F 7/70916; G03F 7/70983; H05G 2/008
See application file for complete search history.

(56) References Cited

U.S. PATENT DOCUMENTS

2011/0002569 A1    1/2011  Derra et al.
2011/0253913 A1   10/2011  Nagai et al.
(Continued)

FOREIGN PATENT DOCUMENTS

EP        2250535 A1     11/2010
JP     2008-277481 A     11/2008
(Continued)

OTHER PUBLICATIONS

International Search Report (English and Japanese) issued in PCT/JP2021/017913, dated Jun. 22, 2021; ISA/JP(5 pages).
(Continued)

*Primary Examiner* — Nicole M Ippolito
*Assistant Examiner* — Hanway Chang
(74) *Attorney, Agent, or Firm* — Harness, Dickey & Pierce, P.L.C.

(57) ABSTRACT

An extreme ultraviolet light (EUV) source apparatus includes a light source part for generating a plasma that emits EUV light; a first vacuum housing in which the light source part is located; a second vacuum housing arranged between the first vacuum housing and a utilizing apparatus in which the EUV light is utilized; and a debris trap located inside the second vacuum housing for deflecting debris particles emitted from the plasma, whereby the debris particles do not ingress into the utilizing apparatus. Between the first and second vacuum housings, there is provided a window through which the EUV light emitted from the light source part passes from the first vacuum housing to the second vacuum housing. A wall of the second vacuum
(Continued)

housing has a through-hole and a window that is configured to allow the EUV light to pass from the second vacuum housing to the utilizing apparatus.

6 Claims, 3 Drawing Sheets

(56) References Cited

U.S. PATENT DOCUMENTS

2012/0248343 A1  10/2012  Nagai et al.
2016/0026091 A1   1/2016  Loopstra et al.

FOREIGN PATENT DOCUMENTS

| JP | 2011-515022 A | 5/2011 |
| JP | 2012-146613 A | 8/2012 |
| JP | 2016-521373 A | 7/2016 |
| JP | 2017-219698 A | 12/2017 |
| WO | 2009-107063 A1 | 9/2009 |
| WO | 2014-154433 A1 | 10/2014 |
| WO | 2016-152020 A1 | 9/2016 |

OTHER PUBLICATIONS

Office Action issued in Japanese Application No. 2020102425, dated Jun. 14, 2022 (4 pages).
Office Action issued in Japanese Application No. 2020102425, dated Nov. 15, 2022 (6 pages).

EXTREME ULTRAVIOLET LIGHT SOURCE DEVICE

CROSS REFERENCE TO RELATED APPLICATIONS

This application is a U.S. National Phase Application under 35 U.S.C. 371 of International Application No. PCT/JP2021/017913, filed on May 11, 2021, which claims priority to Japanese Patent Application No. 2020-102424, filed on Jun. 12, 2020, and Japanese Patent Application No. 2020-102425, filed on Jun. 12, 2020. The entire disclosures of the above applications are expressly incorporated by reference herein.

TECHNICAL FIELD

The present invention relates to extreme ultraviolet light source apparatuses.

BACKGROUND ART

Recently, due to increasing miniaturization and integration of semiconductor integrated circuits, shortening of a wavelength of an exposure light source has been promoted. As a next-generation light source for exposing semiconductors, an extreme ultraviolet light source apparatus (hereinafter also referred to as an "EUV light source apparatus") that emits extreme ultraviolet light (hereinafter also referred to as "EUV (extreme ultraviolet) light") having a wavelength of 13.5 nm has been developed.

There are several known methods for generating EUV light (EUV radiation) in an EUV light source apparatus. One method is to generate a high-temperature plasma by heating and exciting an extreme ultraviolet light radiation subject (hereinafter, also referred to as "EUV radiation subject"), and to generate EUV light emitted from the high-temperature plasma.

EUV light source apparatuses that employ such a method are classified into an LPP (Laser Produced Plasma) method and a DPP (Discharge Produced Plasma) method, depending on the generation scheme.

An EUV light source apparatus of the DPP type applies a high voltage to a gap between electrodes in which a discharge gas containing EUV radiation subject (plasma raw material in a gas phase) is supplied, to generate a high-density and high-temperature plasma by discharge, and utilizes extreme ultraviolet light radiated therefrom. As a specific DPP method as disclosed, for example, in JP-A-2017-219698, a method is proposed in which a liquid high-temperature plasma raw material (for example, Sn (tin)) is supplied to surfaces of electrodes that generate a discharge, an energy beam such as a laser beam is directed to the raw material to vaporize the raw material, and a high-temperature plasma is generated by the discharge. Such an approach may be referred to as LDP (Laser Assisted Discharge Plasma).

The EUV light source apparatus is used as a light source apparatus in a lithography apparatus for manufacturing semiconductor devices. Alternatively, the EUV light source apparatus is used as a light source apparatus in an apparatus for inspecting masks used for lithography. That is to say, the EUV light source apparatus is used as a light source apparatus in another optical apparatus (utilizing apparatus), which uses EUV light.

Since EUV light is easily attenuated, the area from the plasma to the utilizing apparatus is placed in a reduced-pressure atmosphere, that is, in a vacuum environment.

On the other hand, debris is emitted at high speed from the plasma generated by the LDP system. The debris includes tin particles, which are the raw material for the high-temperature plasma, and material particles of the discharge electrodes, which are results of slight chipping of the discharge electrodes due to the energy beam irradiation. Since the debris is an obstruction for the utilizing apparatus, a debris trap has been proposed to deflect the traveling directions of emitted debris particles so that the debris particles do not ingress into the utilizing apparatus (JP-A-2017-219698).

A debris trap uses multiple foils that divide a space in which the debris trap is disposed, and reduce the conductance in the divided sections to increase the pressure. Since the collision probability increases in the sections, in which the pressure is increased, the speed of the debris particles is reduced and the traveling directions of the debris particles are deflected. There are two types of debris traps: a stationary foil trap and a rotating foil trap that adds impact to debris particles and deflects the traveling directions of the debris particles. A single apparatus may be provided with both or one of the two types of traps.

Debris that is blocked by a debris trap is accumulated in a debris container. The accumulation of debris is more efficient when the debris is in a liquid phase since the accumulated debris grows on one or more specific positions when the debris is in a solid phase. Accordingly, it is desirable to wrap a heater wire around the debris container to heat the debris.

However, it is difficult to inspect and repair the heater wire if the heater wire is disposed in a vacuum housing together with the debris container.

In addition, a rotation drive device (e.g., motor) is necessary to rotate a rotating foil trap. Since the foil trap is subjected to heat radiation from the plasma, it is desirable to attach a heat removal mechanism such as a water cooling pipe to the rotation drive device and the rotational shaft thereof in order to prevent overheating.

However, if the rotation drive device is disposed in a vacuum housing together with the rotating foil trap, it is difficult to inspect and repair the wiring that supplies electric power to the rotation drive device and the water cooling pipe.

Accordingly, it is an object of the present invention to provide an extreme ultraviolet light source apparatus in which inspection and repair of a component relevant to a debris trap are easy.

SUMMARY

In accordance with an aspect of the present invention, there is provided an extreme ultraviolet light source apparatus, including a light source part configured to generate a plasma that emits extreme ultraviolet light; a first vacuum housing in which the light source part is located; a second vacuum housing arranged between the first vacuum housing and a utilizing apparatus in which the extreme ultraviolet light is utilized, the second vacuum housing communicating with the utilizing apparatus and the first vacuum housing; and a debris trap located inside the second vacuum housing and configured to deflect traveling directions of debris particles emitted from the plasma, whereby the debris particles do not ingress into the utilizing apparatus. Between the first vacuum housing and the second vacuum housing, there is provided a window through which the extreme ultraviolet light emitted from the light source part passes from the first vacuum housing to the second vacuum housing. A wall of the second vacuum housing has a through-hole and a window that is configured to allow the extreme ultraviolet light to pass from the second vacuum housing to the utilizing apparatus.

In this aspect, a wall of the second vacuum housing in which the debris trap is located has a through-hole in addition to the window through which the extreme ultraviolet light passes from the second vacuum housing to the utilizing apparatus. A component relevant to the debris trap is located outside the second vacuum housing, and the component can execute its function by using the through-hole. By placing the component outside the second vacuum housing, the component can be easily inspected and repaired.

For example, the debris trap may include a rotating foil trap that is located inside the second vacuum housing and is configured to deflect traveling directions of debris particles emitted from the plasma, whereby the debris particles do not ingress into the utilizing apparatus. The extreme ultraviolet light source apparatus may further include a rotation drive device that is located outside the second vacuum housing and is configured to rotate the rotating foil trap, and the rotational shaft of the rotating foil trap, which is rotated by the rotation drive device, may pass through the through-hole.

In this case, the rotation drive device that rotates the rotating foil trap is located outside the second vacuum housing in which the rotating foil trap is located. Therefore, it is easier to inspect and repair the rotation drive device, wiring for the rotation drive device, and the water cooling pipe than in a case in which the rotation drive device is located inside the second vacuum housing. In addition, since the wiring for the rotation drive device and the water cooling pipe are located outside the second vacuum housing, there are fewer sealed points in the second vacuum housing in comparison with a case in which they are located inside the second vacuum housing. Furthermore, since the rotation drive device is located outside the second vacuum housing, overheating of the rotation drive device can be prevented.

Alternatively or additionally, the extreme ultraviolet light source apparatus may further include a debris container that is located outside the second vacuum housing and is configured such that the debris particles that have been deflected by the debris trap falls into the debris container, and the through-hole may connect an interior space of the debris container and an interior space of the second vacuum housing.

In this case, debris particles that were deflected by the debris trap fall into the debris container through the through-hole formed in the wall of the second vacuum housing. The debris container is located outside the second vacuum housing. Therefore, debris does not adhere to the heater wire that heats the debris container, and the heater wire can be easily inspected and repaired. Furthermore, since the debris containers can be easily removed from the second vacuum housing, it is easy to replace the debris container with new one or to take out tin from the debris container.

Preferably, the extreme ultraviolet light source apparatus further includes a monitoring device located outside the second vacuum housing and configured to monitor the extreme ultraviolet light; an extreme-ultraviolet-light guiding hole formed in the wall of the second vacuum housing, the extreme-ultraviolet-light guiding hole allowing the extreme ultraviolet light to pass; and a tube arranged between the extreme-ultraviolet-light guiding hole and the monitoring device, the tube allowing the extreme ultraviolet light to pass.

In this case, the extreme ultraviolet light emitted from the plasma is guided to the monitoring device through the extreme-ultraviolet-light guiding hole in the wall of the second vacuum housing and the tube, and the extreme ultraviolet light can be monitored by the monitoring device. Since the monitoring device is located outside the second vacuum housing, it is easier to inspect and repair the monitoring device in comparison in a case in which it is located inside the second vacuum housing. In addition, since the wiring of the monitoring device is located outside the second vacuum housing, there are fewer sealed points in the second vacuum housing in comparison with a case in which the monitoring device is located inside the second vacuum housing. Furthermore, since the monitoring device is located outside the second vacuum housing, overheating of the monitoring device can be prevented.

DETAILED DESCRIPTION

Hereinafter, with reference to the accompanying drawings, an embodiment according to the present invention will be described. It is of note that the drawings are not necessarily to scale, and certain features may be exaggerated or omitted.

An extreme ultraviolet light source apparatus (EUV light source apparatus) 1 is an apparatus that is configured to emit extreme ultraviolet light (EUV light) having a wavelength of, for example, 13.5 nm, and that can be used as a light source apparatus of a lithography apparatus for manufacturing semiconductor devices or as a light source apparatus for an apparatus for inspecting masks used for lithography.

The EUV light source apparatus 1 according to the embodiment is an EUV light source apparatus of the LDP type. More specifically, the EUV light source apparatus uses an energy beam such as a laser beam to irradiate a plasma raw material in a liquid phase applied to the surfaces of the pair of electrodes to vaporize the plasma raw material, and an electric power source to supply electric power to the electrodes to cause a discharge and generate a high-temperature plasma between the electrodes. EUV light is emitted from the plasma.

Figure 1:
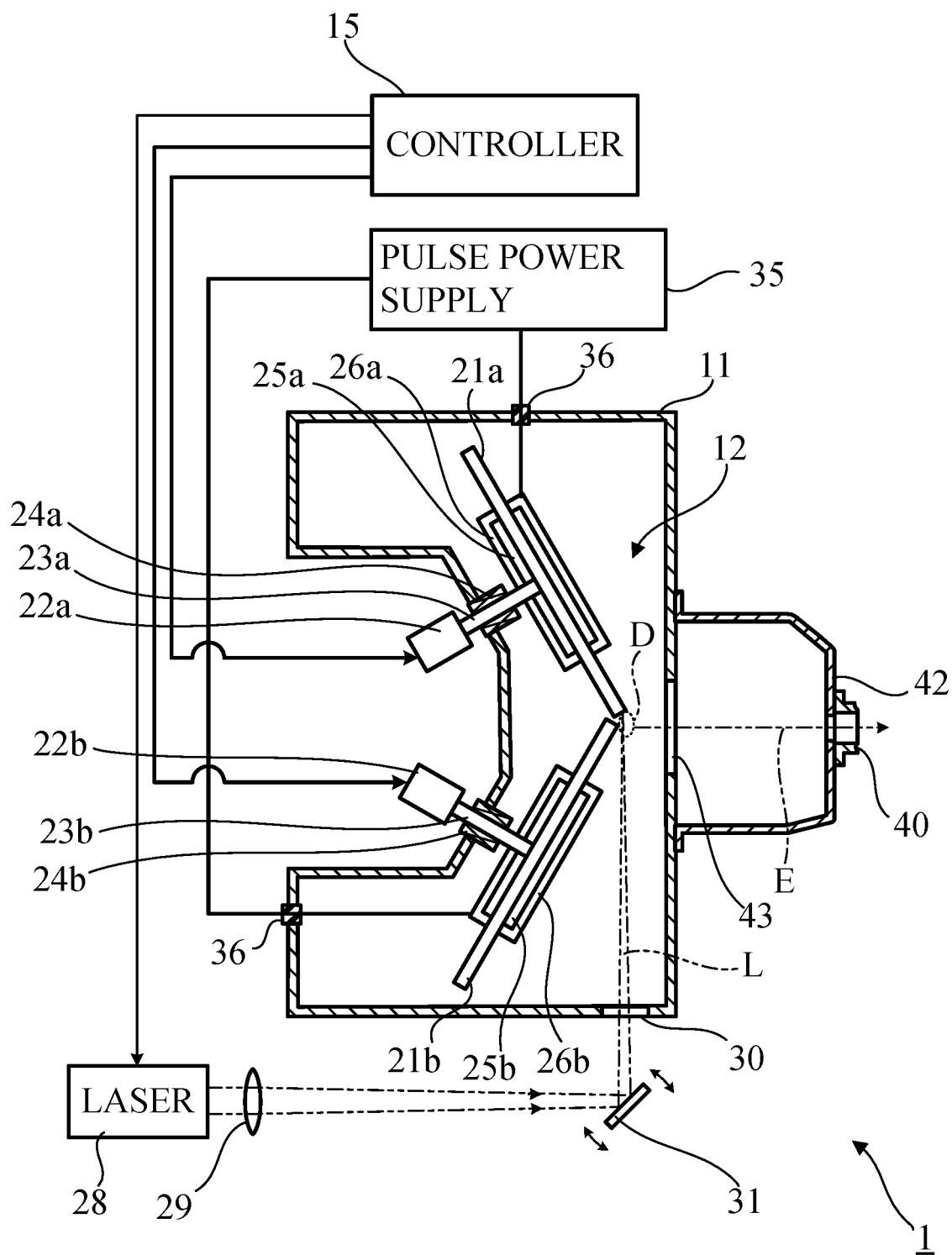
FIG. 1 is a schematic view showing an extreme ultraviolet light source apparatus according to an embodiment of the present invention.

As shown in FIG. 1, the EUV light source apparatus 1 includes a chamber (first vacuum housing) 11 in which the plasma is generated. The chamber 11 is formed of a rigid material, for example, a metal. The interior of the chamber 11 is evacuated to reduce attenuation of the EUV light.

The illustration of the interior of the chamber 11 in FIG. 1 is a plan view of the interior of the chamber 11.

A light source part 12 that emits extreme ultraviolet light is disposed inside the chamber 11. The light source part 12 has a pair of discharge electrodes 21*a* and 21*b*. The discharge electrodes 21*a* and 21*b* are each discs of the same shape and the same size; the discharge electrode 21*a* is used as a cathode, whereas the discharge electrode 21b is used as an anode. The discharge electrodes 21a and 21b are formed of, for example, a high-melting-point metal, such as tungsten, molybdenum, or tantalum.

The discharge electrodes 21a and 21b are disposed at positions spaced apart from each other, but the peripheral portions of the discharge electrodes 21a and 21b are close to each other. At a position in which the peripheral portion of the cathode 21a and the peripheral portion of the anode 21b are closest, a discharge occurs in the gap between the cathode 21a and the anode 21b, and a high-temperature plasma is generated. Hereinafter, the gap between the cathode 21a and the anode 21b at the position in which the peripheral portion of the cathode 21a and the peripheral portion of the anode 21b are closest is referred to as a "discharge region D".

The cathode 21a is connected to the rotational shaft 23a of the motor 22a and rotates about the axis of the cathode 21a. The anode 21b is connected to the rotational shaft 23b of the motor 22b and rotates about the axis of the anode 21b. The motors 22a and 22b are disposed outside the chamber 11, and the rotational shafts 23a and 23b extend from the outside the chamber 11 to the inside. The gap between the rotational shaft 23a and the wall of the chamber 11 is sealed with a sealing member, for example, a mechanical seal 24a, and the gap between the rotational shaft 23b and the wall of the chamber 11 is also sealed with a sealing member, for example, a mechanical seal 24b. The sealing members allow rotation of the rotational shafts 23a and 23b while maintaining a reduced-pressure atmosphere in the chamber 11.

Thus, the discharge electrodes 21a and 21b are respectively driven by separate motors 22a and 22b. The rotation of each of the motors 22a and 22b is controlled by the controller 15.

A container 26a for storing a liquid-phase plasma raw material 25a and a container 26b for storing a liquid-phase plasma raw material 25b are disposed inside the chamber 11. The heated liquid-phase plasma raw materials 25a and 25b are supplied to the containers 26a and 26b. The liquid-phase plasma raw materials 25a and 25b are, for example, tin (Sn).

A lower part of the cathode 21a is immersed in the plasma raw material 25a in the container 26a, and a lower part of the anode 21b is immersed in the plasma raw material 25b in the container 26b. As a result, the plasma raw material adheres to the discharge electrodes 21a and 21b. As the discharge electrodes 21a and 21b rotate, the liquid-phase plasma raw materials 25a and 25b are transported to the discharge region D at which a high-temperature plasma is to be generated.

There is placed outside the chamber 11 a laser (energy beam irradiation device) 28 that irradiates the plasma raw material 25a on the cathode 21a with an energy beam to vaporize the plasma raw material 25a. The laser 28 is, for example, Nd:YVO$_4$ laser (Neodymium-doped Yttrium Orthovanadate laser), and emits an infrared laser beam L. However, the energy beam irradiation device may be another device that emits a beam other than a laser beam capable of vaporizing the plasma raw material 25a.

Illumination timing of the laser beam by the laser 28 is controlled by the controller 15. The infrared laser beam L emitted from the laser 28 is directed to a movable mirror 31.

Between the laser 28 and the movable mirror 31, typically a light-collecting means is disposed. The light-collecting means includes, for example, a condensing lens 29.

The infrared laser beam L is reflected by the movable mirror 31 disposed outside the chamber 11, passes through a transparent window 30 provided on the wall of the chamber 11, and illuminates the outer peripheral surface of the cathode 21a in the vicinity of the discharge region D.

To facilitate irradiation on the outer peripheral surface of the cathode 21a with the infrared laser beam L, the axes of the discharge electrodes 21a and 21b are not parallel. The interval between the rotational shafts 23a and 23b is narrower on the motor side and is wider on the electrode side.

The anode 21b is located between the cathode 21a and the movable mirror 31. In other words, the infrared laser beam L reflected by the movable mirror 31 passes through the vicinity of the outer peripheral surface of the anode 21b, and then reaches the outer peripheral surface of the cathode 21a. The anode 21b is retracted behind the cathode 21a toward the left side of FIG. 1 so as not to interfere with the progress of the infrared laser beam L.

The liquid-phase plasma raw material 25a on the outer peripheral surface of the cathode 21a in the vicinity of the discharge region D is vaporized by irradiation with the infrared laser beam L, and a gas-phase plasma raw material is generated in the discharge region D.

To generate a high-temperature plasma in the discharge region D (to transform the plasma raw material in a gas phase to a plasma), a pulse power supply 35 supplies electric power to the cathode 21a and the anode 21b, to cause a discharge between the cathode 21a and the anode 21b. The pulse power supply 35 periodically supplies pulsed electric power to the discharge electrodes 21a and 21b.

The pulse power supply 35 is located outside the chamber 11. Electric supply lines extending from the pulse power supply 35 pass through sealing members 36, which are embedded in the wall of the chamber 11 and extend into the interior of the chamber 11 to maintain a reduced-pressure atmosphere within the chamber 11.

In this embodiment, the two electric supply lines extending from the pulse power supply 35 are connected to the containers 26a and 26b, respectively. The containers 26a and 26b are made of an electric conductive material, and the plasma raw materials 25a and 25b inside the containers 26a and 26b are an electric conductive material, i.e., tin. The discharge electrodes 21a and 21b are immersed in the plasma raw materials 25a and 25b inside the containers 26a and 26b. Thus, when the pulse power supply 35 supplies pulsed electric power to the containers 26a and 26b, the pulsed electric power is consequently supplied to the discharge electrodes 21a and 21b.

When discharge occurs between the cathode 21a and the anode 21b, the plasma raw material in a gas phase in the discharge region D is heated and excited by a large current, so that a high-temperature plasma is generated. In addition, due to the high heat generated, the liquid-phase plasma raw material 25b on the outer peripheral surface of the anode 21b in the vicinity of the discharge region D is also converted into plasma.

EUV light E is emitted from the high temperature plasma. EUV light E is used in a utilizing apparatus 40, which is another optical apparatus (a lithography apparatus or an inspection apparatus for masks). A connection chamber (the second vacuum housing) 42 is located between the chamber 11 and the utilizing apparatus 40. The interior space of the connection chamber 42 is connected to (communicates with) the chamber 11 through a window 43, which is a through-hole formed in the wall of the chamber 11. The connection chamber 42 is also connected to (communicates with) the utilizing apparatus 40. In the drawings, only a part of the utilizing apparatus 40 is shown. In addition, in FIG. 1, illustration of details of the connection chamber 42 are omitted.

Figure 2:
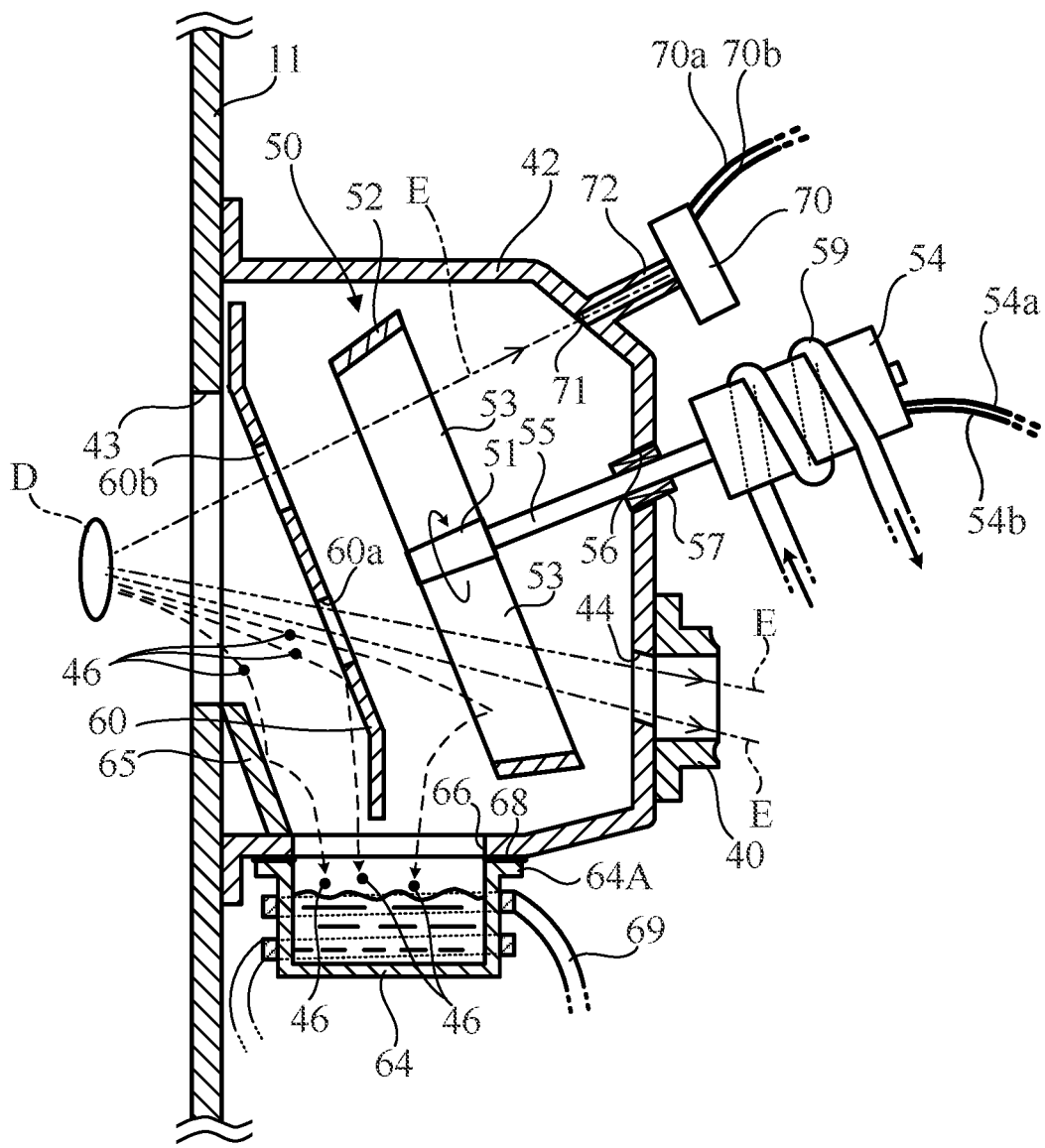
FIG. 2 is a side cross-sectional view showing a part of the extreme ultraviolet light source apparatus according to the embodiment.

As shown in the side cross-sectional view in FIG. 2, the wall of the connection chamber 42 has a window 44, which is a through-hole, and the interior space of the connection chamber 42 is connected to (communicates with) the utilizing apparatus 40 through the window 44. The interior of the connection chamber 42 is also evacuated to reduce the attenuation of EUV light E. The EUV light E emitted from the plasma in the discharge region D passes from the chamber 11 to the connection chamber 42 through the window 43, and is introduced from the connection chamber 42 to the utilizing apparatus 40 through the window 44.

On the other hand, debris particles 46 are emitted from the plasma at high speed. The debris particles 46 include tin particles, which are the raw material for the high-temperature plasma, and material particles of the discharge electrodes 21a and 21b, which are results of slight chipping of the discharge electrodes due to the energy beam irradiation. When the debris particles 46 reach the utilizing apparatus, they may damage or contaminate reflective films of optical elements in the utilizing apparatus 40 and degrade the performance of the optical elements. Accordingly, a debris trap is provided in the connecting chamber 42 to deflect the travelling directions of the debris particles 46 so that debris particles 46 do not ingress into the utilizing apparatus 40. In this embodiment, the debris trap has a rotating foil trap 50 that adds impact to debris particles 46 and deflects the traveling directions of the debris particles 46. Although not shown, a stationary foil trap may be provided in the connection chamber 42.

Figure 3:
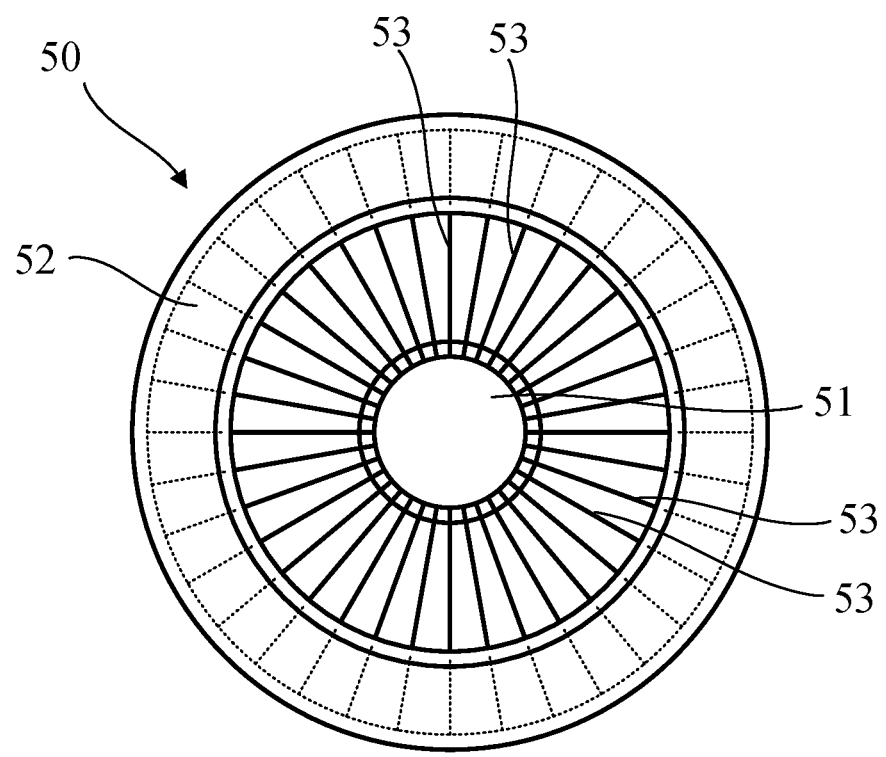
FIG. 3 is a front view of a rotating foil trap in the extreme ultraviolet light source according to the embodiment.

The rotating foil trap 50 has a configuration disclosed in JP-A-2017-219698. Specifically, as shown in FIGS. 2 and 3, the rotating foil trap 50 has a central hub 51, an outer ring 52 that is concentric to the hub 51, and a number of foils 53 disposed between the hub 51 and the outer ring 52. Each foil 53 is a thin film or a thin flat plate. The foils 53 are arranged radially with equal angular intervals. Each foil 53 lies in a plane containing the central axis of the hub 51. The material for the rotating foil trap 50 is a high-melting-point metal such as tungsten and/or molybdenum.

The hub 51 is connected to or coupled with the rotational shaft 55 of a motor (rotation drive device) 54, and the central axis of the hub 51 is aligned with the central axis of the rotational shaft 55. The rotation shaft 55 can be regarded as the rotational shaft of the rotating foil trap 50. Driven by the motor 54, the rotating foil trap 50 rotates, and the rotating foils 53 collide with incoming debris particles 46 and prevent the debris particles 46 from entering the utilizing apparatus 40.

Whereas the rotating foil trap 50 is located inside the connection chamber 42, the motor 54 is located outside the connection chamber 42. A through-hole 56 is formed in the wall of the connection chamber 42, and the rotational shaft 55 passes through the through-hole 56. The gap between the rotational shaft 55 and the wall of the connection chamber 42 is sealed with a sealing member such as a mechanical seal 57.

Since the rotating foil trap 50 is subjected to heat radiation from the plasma, the rotating shaft 55 is sometimes made hollow and cooled by circulating cooling water in order to prevent overheating. In addition, a water cooling pipe 59 is wrapped around the motor 54 to prevent overheating caused by operation of the motor 54 itself. Water circulates through the water cooling pipe 59, and removes heat from the motor 54 through heat exchange.

In addition, to prevent overheating of the rotating foil trap 50 and/or the motor 54, a heat shield panel 60 is located within the connection chamber 42. The material for the heat shield panel 60 is a high-melting-point metal such as tungsten and/or molybdenum. The heat shield panel 60 is interposed between the plasma and the rotating foil trap 50. A through-hole 60a is formed in the heat shield panel. The through-hole 60a is located in a midpoint between the window 44 and the plasma.

The plasma emits EUV light E in various directions. Part of the EUV light E is introduced into the utilizing apparatus 40 through the window 43 of the chamber 11, the through-hole 60a of the heat shield panel 60, the clearances between the multiple foils 53 of the rotating foil trap 50, and the window 44. The foils 53 of the rotating foil trap 50 are arranged parallel to the optical axis of the EUV light E traveling toward the window 44 so as not to block the EUV light E traveling toward the window 44.

In this embodiment, the motor 54 for rotating the rotating foil trap 50 is located outside the connection chamber 42 within which the rotating foil trap 50 is located. Therefore, it is easy to inspect and repair the motor 54, wirings 54a and 54b of the motor 54, and the water cooling pipe 59. In addition, since the wirings 54a and 54b of the motor 54 and the water cooling pipe 59 are located outside the connection chamber 42, the sealed points in the connection chamber 42 are fewer than those in a case in which they are located inside the connection chamber 42. Furthermore, since the motor 54 is located outside the connection chamber 42, the motor 54 can be cooled easily.

The debris particles 46 are emitted from the plasma in various directions together with the EUV light. Some of the debris particles 46 enter the connection chamber 42 through the window 43 of the chamber 11. A debris container 64 is located below the connection chamber 42, so that the debris particles 46 fall into the debris container 64. Some of the debris particles 46 that enter the connection chamber 42 are deposited on the heat shield panel 60. They are melted by the heat radiation from the plasma, and when they reach a certain amount, they gather in a lower portion of the heat shield panel 60 by the force of gravity and fall into the debris container 64 as droplets. Part of debris particles 46 that have entered the connection chamber 42 and tin spilled from the discharge electrodes 21a, 21b, and containers 26a and 26b are led to a receiving plate 65 that is heated by a heater and installed in the connection chamber 42, and fall into the debris container 64. Debris particles 46 that have entered the connection chamber 42 and have passed through the through-hole 60a of the heat shield panel 60 also fall into the debris container 64 since the traveling directions of the debris particles 46 are changed by, for example, rebounding on the foils 53 of the rotating foil trap 50.

The debris container 64 is located outside the connection chamber 42. A through-hole 66 is formed in the bottom wall of the connection chamber 42 to connect the interior space of the debris container 64 with the interior space of the connection chamber 42. The debris container 64 has a flange 64A at the top thereof. The opening of the debris container 64 surrounded by the flange 64A is aligned with the through-hole 66, and the flange 64A is fixed to the bottom wall of the connection chamber 42 with, for example, screws. The gap between the flange 64A and the bottom wall of the connection chamber 42 is sealed with a gasket 68 provided at the gap.

Since most of the debris particles 46 are tin, the debris container 64 may be called a tin recovery container. A heater wire 69 that heats the debris container 64 is wrapped around the debris container 64. During the period of use of the EUV light source apparatus 1, the interior of the debris container 64 is heated by the heater wire 69 at a temperature not less than the melting point of tin (about 232 degrees Celsius), and tin accumulated within the debris container 64 is turned into a liquid phase. The reason for turning tin inside the debris container 64 into liquid is that when solid debris particles 46 accumulate, the accumulated mass grows like stalagmites in a stalactite cave on one or more positions into which the debris particles 46 are likely to fall. If the accumulated debris grows on particular positions, the accumulated debris on few positions may contact the rotating foil trap 50 and may prevent the rotation of the rotating foil trap 50 or damage the rotating foil trap 50 even if there is little debris deposited on other positions. Alternatively, the accumulated debris may reach the desired optical path of the EUV light E traveling toward the window 44 and may block the EUV light E. By turning tin inside the debris container 64 into liquid, the top of accumulated tin is flattened.

When recovering tin accumulated in the debris container 64, the interior pressure of the connecting chamber 42 is returned to the atmospheric pressure, and heating by the heater wire 69 is stopped. Then, after the temperature of the debris container 64 returns to room temperature, the debris container 64 is removed from the connecting chamber 42, and a new debris container 64 without tin is mounted on the connecting chamber 42.

Although tin inside the debris container 64 removed from the connecting chamber 42 is in a solid phase, it can be taken out from the debris container 64 by reheating it, so that the debris container 64 can be reused.

In this embodiment, the debris particles 46, which are deflected by the rotating foil trap 50, fall into the debris container 64 through the through-hole 66 in the wall of the connecting chamber 42. The debris container 64 is located outside the connection chamber 42. Therefore, the debris particles 46 do not adhere to the heater wire 69 that heats the debris container 64, and the heater wire 69 can be easily inspected and repaired. Furthermore, since the debris container 64 can be easily removed from the connection chamber 42, it is easy to replace the debris container 64 with a new debris container 64 and/or to take tin out from the debris container 64.

Furthermore, a monitoring device 70 for monitoring the EUV light E is located outside the connection chamber 42. The monitoring device 70 is a detector that detects the presence of EUV light E or a measuring device that measures the intensity of EUV light E.

An extreme-ultraviolet-light guiding hole 71 that is a through-hole allowing the EUV light E to pass is formed in the wall of the connecting chamber 42, and a tube 72 through which the EUV light E pass without leaking is disposed between the extreme-ultraviolet-light guiding hole 71 and the monitoring device 70.

A through-hole 60b is formed in the above-mentioned heat shield panel 60, and the monitoring device 70, the extreme-ultraviolet-light guiding hole 71, and the tube 72 are aligned with an extension of a straight line connecting the plasma and the through-hole 60b. Therefore, part of the EUV light E emitted from the plasma reaches the monitoring device 70 through the window 43 of the chamber 11, the through-hole 60b of the heat shield panel 60, the clearances between the multiple foils 53 of the rotating foil trap 50, the extreme-ultraviolet-light guiding hole 71 in the wall of the connecting chamber 42, and the lumen of the tube 72.

Thus, the EUV light E can be monitored by the monitoring device 70. Since the monitoring device 70 is located outside the connection chamber 42, it is easier to inspect and repair the monitoring device 70 and wirings 70a and 70b for the monitoring device 70 than in a case in which the monitoring device 70 is located inside the connection chamber 42. In addition, since the wiring 70a and 70b of the monitoring device 70 are located outside the connection chamber 42, the sealed points in the connection chamber 42 are fewer than those in a case in which they are located inside the connection chamber 42. Furthermore, since the monitoring devices 70 are located outside the connection chamber 42, overheating of the monitoring devices 70 can be prevented.

The present invention has been shown and described with reference to preferred embodiments thereof. However, it will be understood by those skilled in the art that various changes in form and detail may be made without departing from the scope of the invention as defined by the claims. Such variations, alterations, and modifications are intended to be encompassed in the scope of the present invention.

The invention claimed is:

1. An extreme ultraviolet light source apparatus, comprising:
   a light source part configured to generate a plasma that emits extreme ultraviolet light;
   a first vacuum housing in which the light source part is located;
   a second vacuum housing arranged between the first vacuum housing and a utilizing apparatus in which the extreme ultraviolet light is utilized, the second vacuum housing communicating with the utilizing apparatus and the first vacuum housing; and
   a debris trap located inside the second vacuum housing and configured to deflect traveling directions of debris particles emitted from the plasma, whereby the debris particles do not ingress into the utilizing apparatus; and
   a window provided between the first vacuum housing and the second vacuum housing, the window being configured to allow the extreme ultraviolet light emitted from the light source part to pass from the first vacuum housing to the second vacuum housing,
   a wall of the second vacuum housing having a through-hole and a window configured to allow the extreme ultraviolet light to pass from the second vacuum housing to the utilizing apparatus.

2. The extreme ultraviolet light source apparatus according to claim 1, wherein the debris trap comprises a rotating foil trap located inside the second vacuum housing, the rotating foil trap being configured to deflect traveling directions of debris particles emitted from the plasma, whereby the debris particles do not ingress into the utilizing apparatus,
   the extreme ultraviolet light source apparatus further comprising a rotation drive device located outside the second vacuum housing and configured to rotate the rotating foil trap,
   wherein the rotating foil trap having a rotational shaft rotated by the rotation drive device, the rotational shaft passing through the through-hole.

3. The extreme ultraviolet light source apparatus according to claim 2, further comprising:
   a monitoring device located outside the second vacuum housing and configured to monitor the extreme ultraviolet light;
   an extreme-ultraviolet-light guiding hole formed in the wall of the second vacuum housing, the extreme-ultraviolet-light guiding hole allowing the extreme ultraviolet light to pass; and
   a tube arranged between the extreme-ultraviolet-light guiding hole and the monitoring device, the tube allowing the extreme ultraviolet light to pass.

4. The extreme ultraviolet light source apparatus according to claim 2, further comprising a debris container located outside the second vacuum housing, the debris container being configured such that the debris particles that have been deflected by the debris trap falls into the debris container,
the wall of the second vacuum housing having a further through-hole that connects an interior space of the debris container with an interior space of the second vacuum housing.

5. The extreme ultraviolet light source apparatus according to claim 1, further comprising a debris container located outside the second vacuum housing, the debris container being configured such that the debris particles that have been deflected by the debris trap falls into the debris container,
wherein the through-hole connects an interior space of the debris container with an interior space of the second vacuum housing.

6. The extreme ultraviolet light source apparatus according to claim 5, further comprising:
a monitoring device located outside the second vacuum housing and configured to monitor the extreme ultraviolet light;
an extreme-ultraviolet-light guiding hole formed in the wall of the second vacuum housing, the extreme-ultraviolet-light guiding hole allowing the extreme ultraviolet light to pass; and
a tube arranged between the extreme-ultraviolet-light guiding hole and the monitoring device, the tube allowing the extreme ultraviolet light to pass.

\* \* \* \* \*